(12) United States Patent
Lee

(10) Patent No.: US 6,391,500 B1
(45) Date of Patent: May 21, 2002

(54) PHOTOMASK FOR OBTAINING A GRADED PATTERN PROFILE ON A PHOTORESIST

(75) Inventor: Byung Chul Lee, Kyungg-Do (KR)

(73) Assignee: ANAM Semiconductor, Inc. (KR)

( * ) Notice: Subject to any disclaimer, the term of this patent is extended or adjusted under 35 U.S.C. 154(b) by 20 days.

(21) Appl. No.: 09/684,062

(22) Filed: Oct. 6, 2000

(30) Foreign Application Priority Data

Oct. 6, 1999 (KR) .............................. 99-42955

(51) Int. Cl.[7] .............................. G03F 9/00; G03C 5/00
(52) U.S. Cl. .............................. 430/5; 430/322
(58) Field of Search .............................. 430/5, 322, 394, 430/22; 356/400, 401

(56) References Cited

U.S. PATENT DOCUMENTS 5,656,403 A * 8/1997 Shieh ............................ 430/5
5,731,109 A * 3/1998 Hwang ............................ 430/5

* cited by examiner

Primary Examiner—S. Rosasco
(74) Attorney, Agent, or Firm—Anderson Kill & Olick, P.C.

(57) ABSTRACT

A photomask for use in a photolithography technique includes a transparent portion for transmitting light from a light source, an opaque portion coated with an opaque material for interrupting the light from the light source, and a border portion positioned between the transparent and the opaque portions. The border portion includes a number of patterned structures coated with the opaque material and arranged along an edge of the opaque portion, wherein the amount of light passing through the border portion is gradually increased when moving from a first border line between the opaque and the border portions to a second border line between the border and the transparent portions.

9 Claims, 3 Drawing Sheets

PHOTOMASK FOR OBTAINING A GRADED PATTERN PROFILE ON A PHOTORESIST

FIELD OF THE INVENTION

The present invention relates to a photomask for use in forming a pattern in a photoresist layer; more particularly, to a photomask for obtaining a graded pattern profile on a photoresist.

BACKGROUND OF THE INVENTION

Various techniques are known in the prior art for manufacturing a device on a semiconductor wafer, e.g., Si-substrate. Typically, photolithography processes are utilized in forming desired patterns on the wafer or a layer formed thereon.

In a photolithography process, a photoresist layer is applied first on an underneath layer to be processed and then the photoresist layer is exposed to light through a patterned photomask. By developing such processed photoresist layer, a pattern on the photomask is transferred onto the photoresist layer. The photoresist patterns generally have vertical side walls. When the photoresist patterns thus produced are used as etch masks in a subsequent dry etch step, the shapes of the holes in the photoresist patterns are transferred to the underneath etched layer, which, in turn, ceates holes on the underneath etched layer having vertical side walls.

Problems arise when depositing a thin film layer on such a structure. The deposited layer may be non-uniform or too thin, particularly in the region of edges or side walls of the holes, leading to a poor step coverage. Typical example of such phenomenon is a metal line with weak spots along side walls and edges of contact holes formed in an insulation layer. These defects are responsible for an increased failure rate, yield and reliability of the device.

One way to improve the step coverage of metal films is to make sloping side walls of holes in a patterned layer, e.g., by sputter-etching the side walls of the holes by using an inert gas, e.g., argon (Ar), after forming a barrier metal on the side walls of the holes.

FIG. 1 is a schematic cross sectional view showing a patterned oxide layer 2 having a hole 5, side walls of the hole 5 being inclined. The patterned oxide layer 2 is formed by: first, depositing an oxide layer on top of a wafer 1; patterning the oxide layer to form the hole 5 by using a photolithography technique; covering side walls of the hole 5 with a barrier metal layer 3; and sputter-etching the patterned oxide layer 2 to remove edges 4 of the hole 5 in order to obtain an inclined side wall profile.

There are certain deficiencies associated with the formation of the patterned oxide layer 2. First of all, the covering and sputter-etching steps should be added to the manufacturing process in order to solve the problem associated with the step coverage, which may add up the manufacturing cost and complexity. The thickness uniformity may also be compromised by the sputter-etching step.

Furthermore, since the side wall of the hole 5 is not of a rouneded profile but still has vertical portions at lower parts 7 thereof and angled edges between the upper and the lower parts 6 and 7, the inclined hole structure of the prior art shown in FIG. 1 may still be subject to low step coverage problems.

SUMMARY OF THE INVENTION

It is, therefore, an object of the present invention to provide a photomask capable of providing a smoothly rounded pattern profile on a photoresist layer.

In accordance with the present invention, there is provided a photomask for use in a photolithography technique, comprising: a transparent portion for transmitting light from a light source; an opaque portion coated with an opaque material for interrupting the light from the light source; and a border portion positioned between the transparent and the opaque portions, wherein the border portion includes a number of patterned structures coated with the opaque material and arranged along an edge of the opaque portion, the amount of light passing through the border portion gradually increasing when moving from a first borderline between the opaque and the border portions to a second borderline between the border and the transparent portions.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
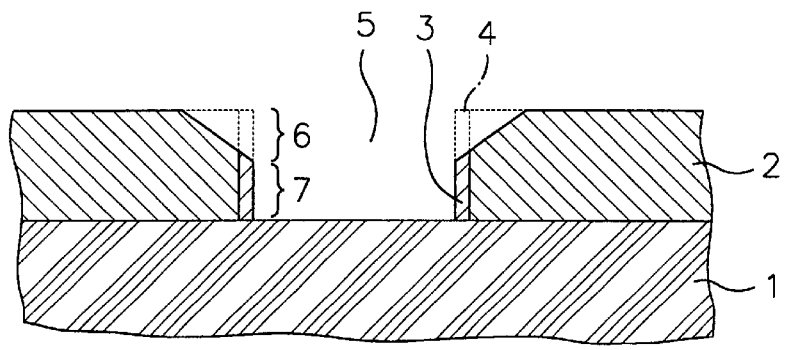
FIG. 1 is a schematic cross sectional view setting forth a patterned layer structure of the prior art for improving step coverage.
Figure 2:
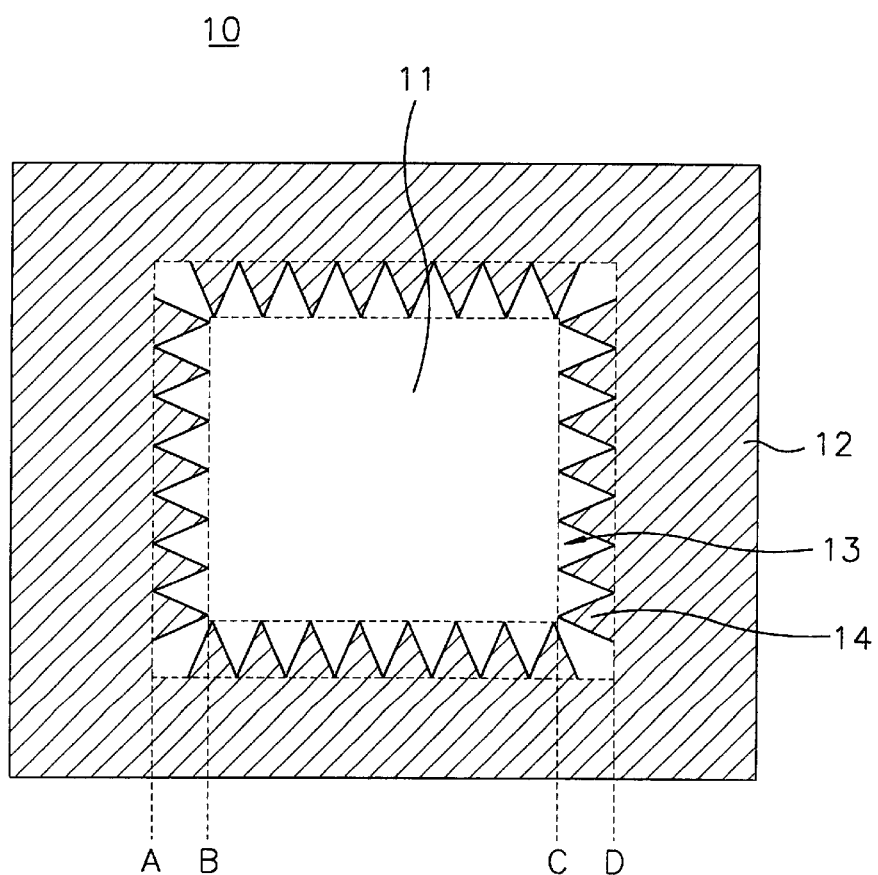
FIG. 2 represents a top view depicting a photomask in accordance with the present invention.

An exemplary photomask 10 for use in a photolithography technique in accordance with the present invention includes a transparent portion 11 for transmitting light, e.g., ultraviolet light, electron beam, X-ray or the like, from a light source, an opaque portion 12 coated with an opaque material for interrupting the light from the light source, and a border portion 13 residing between the transparent portion 11 and the opaque portion 12. The border portion 13 includes a number of patterned structures 14, each having, e.g., a triangle, trapezoid or half-circle shape. The patterned structures 14 of the border portion 13 are coated with the same material as the one used in the opaque portion 12 and are arranged along edges of the opaque portion 12. The size of each patterned structure is preferably smaller than a minimum dimension which can be defined by the optical system to be used, that is, a wavelength of the light from the light source. In FIG. 2, A and D are first borderlines between the opaque portion 12 and the border portion 13, and B and C are second borderlines between the transparent portion 11 and the border portion 13.

As is well known, the photomask 10 can be formed by coating an opaque material, e.g., Chromium (Cr), Iron-oxide ($Fe_2O_3$) or the like, on a glass or quartz plate.

Figure 3:
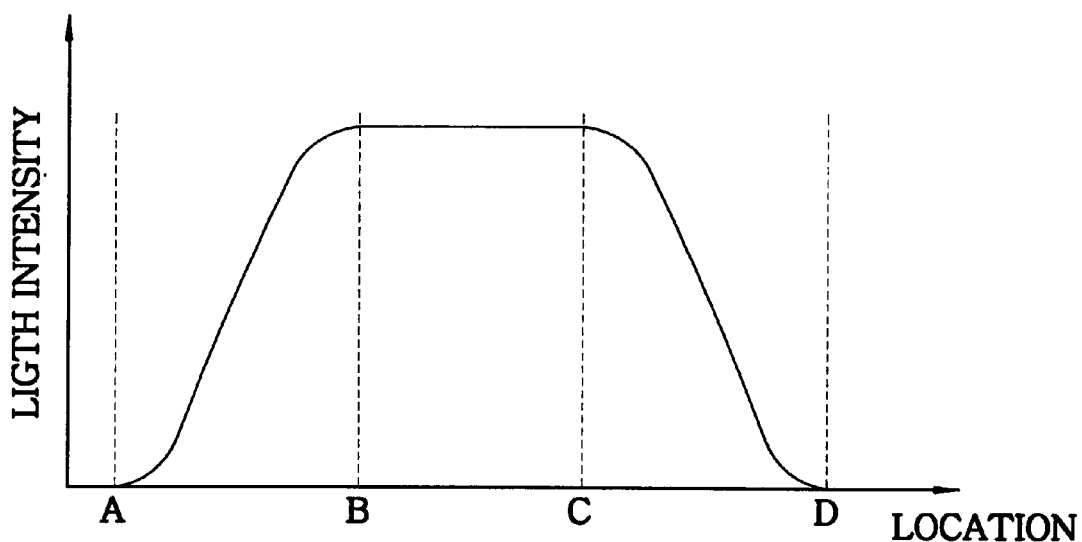
FIG. 3 describes an exemplary light intensity profile produced by using the photomask of the present invention.
Figure 4:
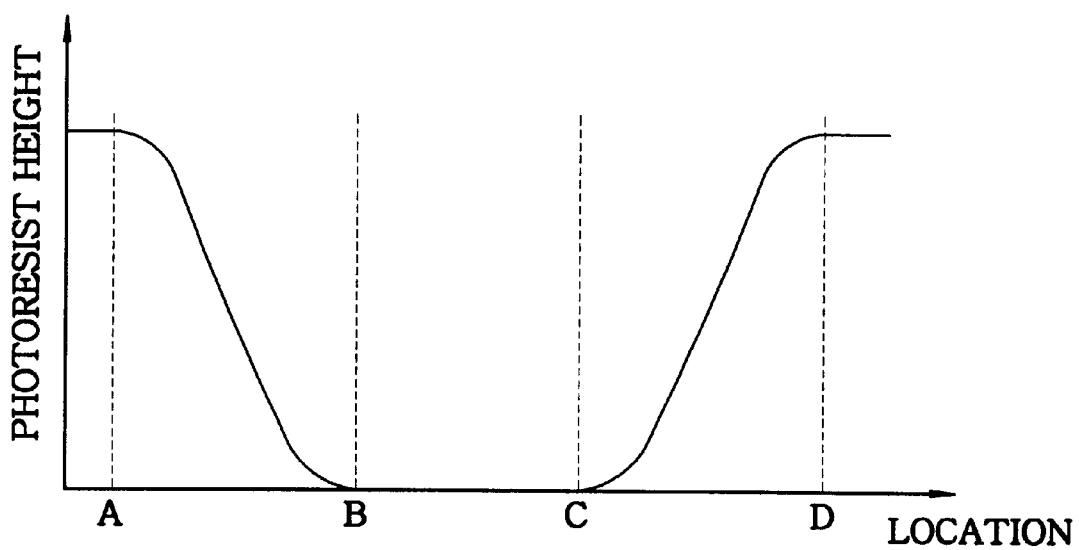
FIG. 4 presents an exemplary photoresist pattern profile produced by using the photomask of the present invention.

Referring to FIGS. 3 and 4, there are exemplarily illustrated an intensity profile of light passing through the photomask 10 and a photoresist pattern profile produced by using the photomask 10, respectively. As shown in FIG. 2, the area of the opaque material in the border portion is gradually decreased when moving along a direction from the first borderlines A, D to the second borderlines B, C. Therefore, the light intensity on the photoresist is also gradually increased in that direction as shown in FIG. 3, and a photoresist profile having a hole with rounded edges at the bottom, i.e., B and C, and at the top, i.e., A and D, thereof and inclined side walls between the top and the bottom edges, i.e., between A and B, and C and D, can be obtained after the developing process, as shown in FIG. 4, when a positive photoresist is used. It would be apparent to those skilled in the art that a similar rounded photoresist pattern profile can be obtained as well when using a negative photoresist.

Figure 5:
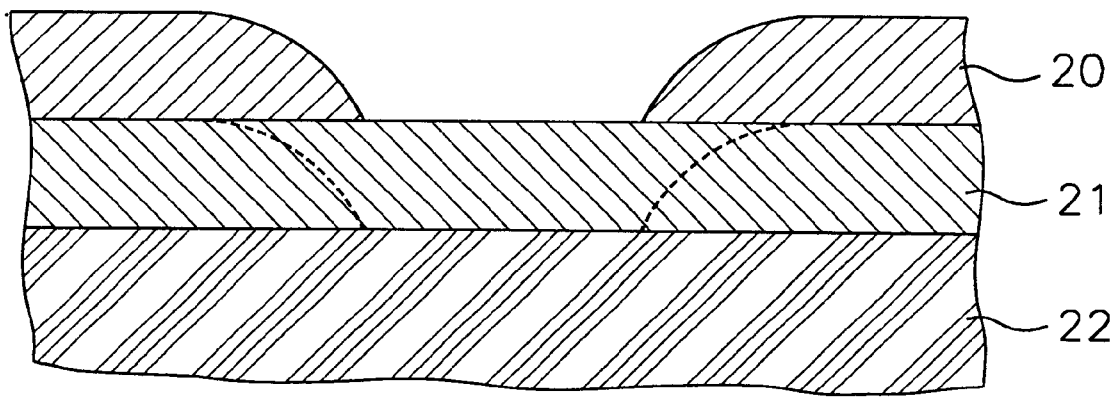
FIG. 5 illustrates an exemplary cross sectional view representing the photoresist patterned by using the photomask shown in FIG. 2 and formed on top of an oxide layer deposited on a wafer in accordance with the present invention.

FIG. 5 is an exemplary cross sectional view illustrating a photoresist 20 patterned by using the photomask 10 (shown in FIG. 2) and formed on top of an oxide layer 21 deposited on a Si-substrate 22. The patterned photoresist 20 is obtained by selectively exposing a photoresist layer to light by using the photomask 10 and developing the exposed photoresist layer to remove the exposed portion of the photoresist layer. The patterned photoresist 20 has a smoothly rounded pattern profile below the border portion 13 of the photomask 10. By immersing the patterned photoresist 20 in HF, the oxide layer 21 can be selectively removed; and, therefore, the rounded pattern profile of the patterned photoresist 20 will be transferred to the oxide layer 21 as indicated with a dotted line. Thereafter, a subsequent layer can be deposited on the patterned oxided layer without incurring the low step coverage problems.

Although the present invention has been described with reference to a particular photomask having a mask pattern shown in FIG. 2, it should be understood to those skilled in the art that the present invention can be practiced in any photomasks having various patterns other than the one shown in FIG. 2. In the present invention detailed photolithography process and apparatus have not been described for the sake of simplicity. However, it should be apparent to those skilled in the art that the photomask of the present invention can be applied to any photolithography methods and apparatus for providing rounded pattern profiles in a photoresist layer in order to remove or reduce low step coverage problems of the prior art.

While the present invention has been shown and described with respect to the particular embodiments, it will be apparent to those skilled in the art that many changes and modifications may be made without departing from the spirit and scope of the invention defined in the appended claims.

What is claimed is:

1. A photomask for use in a photolithography process comprising:

a transparent portion for transmitting light from a light source;

an opaque portion coated with an opaque material for interrupting the light from the light source; and a border portion positioned between the transparent and the opaque portions, wherein the border portion includes a number of patterned structures coated with the opaque material and arranged along an edge of the opaque portion, the amount of light passing through the border portion gradually increasing when moving from a first borderline between the opaque and the border portions to a second borderline between the border and the transparent portions.

2. The photomask of claim 1, wherein each of the patterned structures has the shape of a triangle, trapezoid or half-circle.

3. The photomask of claim 1, wherein the size of each patterned structure is smaller than a minimum dimension defined by a wavelength of the light from the light source for the practice of the photolithography process.

4. The photomask of claim 1, wherein the opaque material of the opaque portion and the patterned structure is selected from a group of Chromium (Cr) or Iron oxide ($Fe_2O_3$).

5. A photolithography process carried out by using the photomask of claim 1.

6. A photolithography apparatus for producing a rounded pattern profile of a photoresist by using the photomask of claim 1.

7. A photomask for use in a photolithography technique, including:

a transparent substrate; and an opaque coat partially covering the transparent substrate with an opaque material, the opaque coat includes an opaque portion for interrupting light from a light source and a border portion including a number of patterned structures coated with the opaque material and are arranged along an edge of the opaque portion, wherein the area of each of the patterned structures is gradually decreased when moving from a first border line to the second border line.

8. The photomask of claim 7, wherein each of the patterned structures has the shape of a triangle, trapezoid or half-circle.

9. The photomask of claim 7, wherein the size of each patterned structure is smaller than a minimum dimension defined by a wavelength of the light from the light source for the practice of the photolithography process.

* * * * *